(12) United States Patent
Meagley et al.

(10) Patent No.: US 7,235,344 B2
(45) Date of Patent: Jun. 26, 2007

(54) ENERGY HARVESTING MOLECULES AND PHOTORESIST TECHNOLOGY

(75) Inventors: Robert P. Meagley, Hillsboro, OR (US); Michael D. Goodner, Hillsboro, OR (US); Robert E. Leet, Scottsdale, AZ (US); Michael L. McSwiney, Scappoose, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/881,475

(22) Filed: Jun. 30, 2004

(65) Prior Publication Data

US 2006/0003253 A1   Jan. 5, 2006

(51) Int. Cl.
*G03C 1/73* (2006.01)
*G03C 1/74* (2006.01)
*G03F 7/09* (2006.01)
*G03F 7/20* (2006.01)
*G03F 7/30* (2006.01)

(52) U.S. Cl. ............... 430/270.1; 430/914; 430/271.1; 430/325; 430/326; 430/921; 430/925; 430/907; 430/905

(58) Field of Classification Search ............ 430/270.1, 430/325, 326, 271.1, 905, 914, 921
See application file for complete search history.

(56) References Cited

U.S. PATENT DOCUMENTS 5,198,153 A * 3/1993 Angelopoulos et al. ..... 252/500

2002/0182541 A1* 12/2002 Gonsalves ............... 430/287.1
2005/0221220 A1* 10/2005 Meagley .................. 430/270.1

FOREIGN PATENT DOCUMENTS

| EP | 0472290 | 2/1992 |
|---|---|---|
| EP | 0473547 | 3/1992 |
| EP | 0773478 | 5/1997 |
| WO | WO 97/22910 | 6/1997 |

OTHER PUBLICATIONS

International Search Report; PCT/US2005/022930; International Filing Date Jun. 27, 2005.
Ingvarsson, S., et al., "The role of electron scattering in magnetization relaxation in thin $Ni_{81}Fe_{19}$ films," The American Physical Society (2002).

(Continued)

*Primary Examiner*—Sin Lee
(74) *Attorney, Agent, or Firm*—Blakely, Sokoloff, Taylor & Zafman LLP

(57) ABSTRACT

A composition including a first moiety; and a different second moiety capable of harvesting energy from an external source, wherein the second moiety is positioned such that energy harvested at the second moiety may be transferred to the first moiety. An article of manufacture including a film including a first moiety and a different second moiety capable of harvesting energy from an external source, wherein the second moiety is positioned such that collectively the first and second moieties have an electron capture cross-section greater than the electron capture cross-section of the first moiety alone. A method including forming a film on a substrate including a first moiety and a different second moiety; exposing the film to photonic or charged particle radiation; and patterning the film.

11 Claims, 3 Drawing Sheets

OTHER PUBLICATIONS

Okamoto, T., et al., "Possibility of local density estimation of polymeric insulating materials for XLPE power cables," (1997) pp. 78-79.

Persson, P., et al., "Shake-up and shake-off excitations with associated electron looses in X-ray studies of proteins," Abstract, Protein Sci. Oct. 10, 2001.

Pianetta, P., "X-ray data booklet, Section 3.2: Low-energy electron ranges in matter," (6 pages), Jan. 2001.

Polzonetti, G., et al., "NEXAFS investigation of organometallic polymer arrays, promixing materials for chemical sensors and optical devices, and precursor molecules," Lure meetings (2001).

* cited by examiner

ENERGY HARVESTING MOLECULES AND PHOTORESIST TECHNOLOGY

BACKGROUND

1. Field

Circuit patterning.

2. Background

Patterning is the series of steps that results in the removal of selected portions of surface layers added on a substrate such as a wafer. Patterning defines the surface parts of devices that make-up a circuit. One goal of patterning is to define in or on the wafer surface, the parts of the device or circuit in the exact dimensions (feature size) required by the circuit design and to locate the parts in their proper location on a wafer surface. Generally speaking, patterning sets the critical dimension of devices of a circuit.

Generally, patterning is accomplished through photolithography techniques. In general, photolithography is a multi-step pattern transfer process whereby a pattern contained on a reticle or photomask is transferred onto the surface of a wafer through a lithographic imaging step, including the development of a light sensitive material (e.g., photoresist) on the wafer. In general, the smallest feature printable by the imaging system is proportional to the following quantity:

$$\frac{\lambda}{NA}$$

where $\lambda$ is the wavelength of light used in imaging the mask onto the wafer and NA is the numerical aperture of the projection optics.

One goal of circuit designers is to reduce the feature size (the critical dimension) of devices of a circuit, i.e., reduce the smallest feature patternable. A reduction in wavelength of light used in patterning will reduce the smallest feature patternable as will an increase in the numerical aperture of the lens. Unfortunately, an increase in the numerical aperture of the lens tends to be quite expensive. Thus, the recent trend has been to reduce the wavelength. Currently, wavelengths of light used in patterning integrated circuits are 248 nanometers (nm) or less for a critical dimension on the order of 130 nm. As the critical dimension approaches 100 nanometers or less, the wavelength will be reduced to under 200 nanometers, and will eventually lie in the extreme ultraviolet (EUV) region, 10 to 100 nm. In fact, for certain applications, shorter wavelength photons, i.e. less than 10 nm (xray) or charged particles (electrons, ions) may be employed.

In the general course of patterning, the image of a reticle or photomask is projected onto a wafer by an imaging system. Typically, the imaging system is refractive and is composed of lenses fabricated out of glass or quartz. EUV radiation, however does not pass through quartz or glass. Thus EUV imaging relies on reflective optics. EUV radiation is reflected off a mirror onto a wafer in a photolithographic imaging step. In charged particle lithography, electric and or magnetic fields are used in the place of reflective or refractive materials to direct and focus and imaging radiation.

In one photoresist composition suitable for use in patterning circuit devices using EUV, the composition includes a photoacid generator (PAG) in a polymer having a deprotection unit. Upon irradiation, the PAG generates an acid that, in a subsequent post-exposure-bake process catalyzes a deprotection reaction, a cross-linking reaction, or other reaction that affects the solubility of the photoresist. The result is that the solubility of the resist composition in a developer is differentiated between the exposed and unexposed regions and as a result either positive or negative images are achieved.

Electron absorption is recognized as one recognized mechanism by which EUV photoresist films receive patterning signals to form lithographic features.

These electrons are the product of the original aerial image from EUV photons impinging upon and ionizing atoms in the photoresist. The distance an electron travels from the point of ionization within the film or at the uppermost part of the substrate (e.g. the substrate surface) to a PAG is a propagation length. Typically too, PAGs such as triphenyl sulfoniums are relatively small species (e.g., volume on the order of about one cubic nanometer) and include relatively electron transparent moieties (e.g. hydrocarbons and sulfur) and therefore have a relatively limited electron capture cross-section. Thus, the uncontrolled propagation length of electrons within the photoresist blurs the original aerial image by a finite amount, limiting the resolution of the film and contributing to feature roughness.

DETAILED DESCRIPTION

A composition, an article of manufacture, and a method are described. In one embodiment, the composition is suitable for use in photochemical processes, such as a photoresist material for use in patterning circuit devices. In another embodiment, the composition is suitable as a photoresist material for patterning circuit devices using extreme ultraviolet (EUV) radiation. Other applications of use of the composition include, but are not limited to, lithographic mask fabrication (e.g., multilayer reflective masks, transmissive masks, etc.), micro-electromechanical system (MEMS) fabrication, microfluidic technology fabrication and device fabrication for biotechnology by lithography. In one embodiment, an article of manufacture includes a substrate and a film on the substrate. Applications in which an article of manufacture may find use include, but are not limited to, circuit patterning, lithographic masks, MEMS, microfluidic technology fabrication, and biotechnology. In one embodiment, a method includes forming a film on a substrate.

Referring to a composition that may be suitable in an article of manufacture, in one embodiment, a composition includes a first moiety such as a PAG having a property capable of modifying the composition in response to an energy transfer. The composition also includes a different second moiety capable of harvesting energy from an external energy source. The second moiety is positioned in the composition such that energy harvested at the second moiety may be transferred to the first moiety. In this manner, the second moiety may act as a collector or antenna directing an energy (e.g., electrical energy) to the PAG.

Representatively, the second moiety may be covalently bonded to the first moiety or associated with the first moiety via hydrophobic forces, hydrogen or ionic bonding. The second moiety improves the probability of electron capture by the first moiety (e.g., by the PAG). Mechanistically, the second moiety functions by capturing electron density and directing such electron density into the first moiety (e.g., into the PAG).

Figure 1:
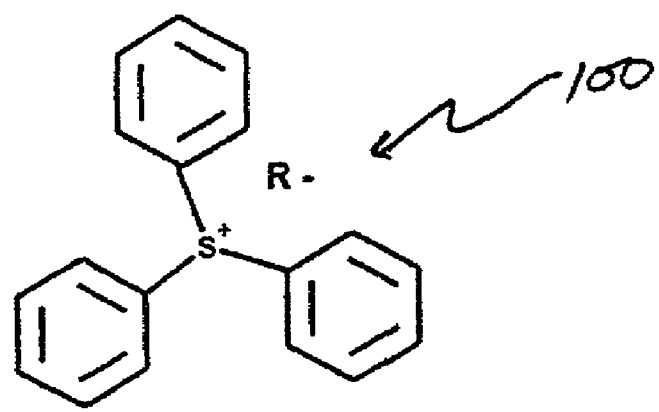
FIG. 1 shows a chemical representation of a photoacid generator (PAG).

FIG. 1 illustrates a triphenyl sulfonium PAG which binds aromatic groups to a central sulfur atoms bearing a positive charge. Representatively, PAG 100 includes an R group that is an anion of a strong acid, e.g., nonafluorobutane sulfonate, hexafluoroantimonate, perfluorooctane sulfonate (PFOS), etc.

Figure 2:
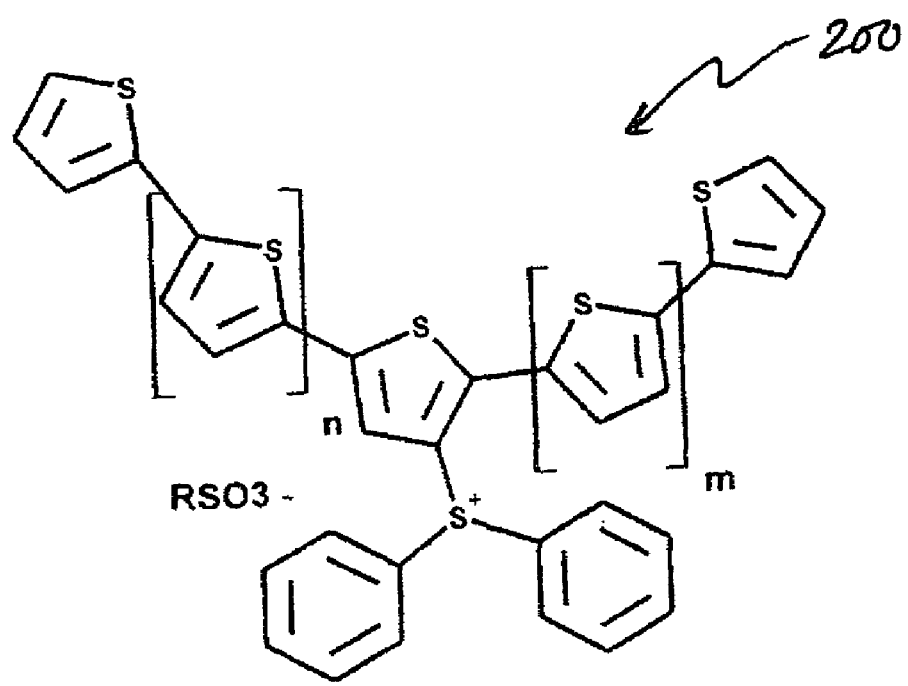
FIG. 2 shows a chemical representation of a PAG functionalized with a conductive polymer collector or antenna.

FIG. 2 shows an example of a sulfonium PAG functionalized with a conductive polymer (in this example oligothiophene). In this example, the conductive polymer of molecule 200 is covalently bonded to the sulfur atom (displacing an aromatic group). As a conductive (or semi-conductive) moiety, the conductive polymer in a photoresist composition may act as a collector or antenna and harvest energy (e.g., an electron) and direct the harvested energy to the PAG. When the PAG is excited by the harvested energy, the PAG will break apart as described in the background section (vide supra). In one embodiment, "m" and "n" designate a number of repeating units, for example, 20 or less.

Suitable species for a second moiety as a collector or antenna to harvest energy include, but are not limited to, electrically conductive and semi-conductive species (e.g., boron, silicon, carbon, sulfur). Examples include polymers such as polyphenylene, polythiophene, polyanaline, polypyrole, polyacetylene; functionalized polymers (e.g., polythiophenes functionalized with hydrophobic groups (e.g., hydrocarbon, fluorocarbon, aryl moieties, etc.) or hydrophilic groups (e.g. alcohols, ethers, esters, sulfonates, polyethyleneglycol moieties, etc); graphitic carbon; carbon nanotubes; C60; fullerenes; silicon nanoparticles and/or nanowires (e.g., 3–5 nanoparticle and/or nanowires). In the case of a photoactive system, suitable species for a second moiety have a chemical structure that will not alter a photonic (chemical, kinetic) property of a film. In the example where the film is an EUV photoresist, a second moiety suitable as a collector or antenna has a chemical structure that will be activated (e.g., harvest energy) at wavelengths on the order of less than 157 nanometers (e.g., 10 to 100 nanometers). Suitable species for a second moiety are also those that do not modify a desired physical or chemical property of a film in which the second moiety is employed (e.g., will not crystallize out of a polymer matrix or significantly perturb chemical kinetics).

As noted above, the second moiety as a collector or antenna may be bound to a PAG. Alternatively, the second moiety as a collector or antenna may be associated to a PAG through hydrophobic forces, ionic or hydrogen bonding. In the example of a film such as a photoresist film having a polymer backbone, the second moiety may be bound to the polymer backbone (becoming a side chain of the backbone), bound to a side chain of the polymer backbone, or blended with the polymer backbone as a discrete molecule. In the example of a film such as a photoresist film comprising a matrix formed from a small molecule (e.g. a molecular matrix comprising species <~2000 Daltons), the second moiety may be bound to the molecular matrix (becoming a side chain of the matrix molecule), bound to a side chain of the matrix molecule, or blended with the matrix molecule as a discrete additive.

Figure 3:
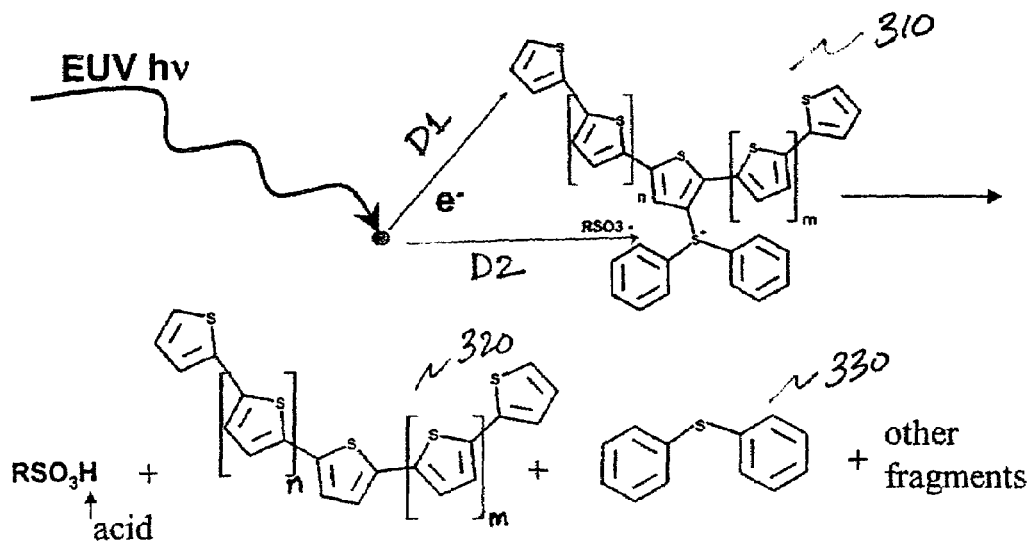
FIG. 3 shows a mechanism for electron harvesting by a PAG functionalized with a conductive polymer collector or antenna.

FIG. 3 illustrates a harvesting mechanism. In one example, a photoresist or other composition includes a number of active molecules including a PAG and a collector or antenna. FIG. 3 shows photonic energy impinging on the composition, e.g., within a photoresist film on a wafer. In this embodiment, the incident photon ionizes an atom in the photoresist film inducing energy transfer in the form of an ejected electron (photo-ionization). FIG. 3 shows an electron in the film a distance from active molecule 310 at an arbitrary relative geometry to the approach vector of the electron. FIG. 3 shows the electron a distance D1 from the collector or antenna portion of molecule 310 and a distance D2 from the PAG portion of the molecule. In this example, distance D1 is less than distance D2. The example illustrates the effective size of the PAG has increased by a quantity proportional to D2 minus D1. This effective size is modulated by the approach vector of the electron relative to the geometry of the PAG-collector system. Thus, the electron capture cross-section of the active molecule is greater than if the molecule constituted only the PAG. FIG. 3 also shows the result (the right side of the arrow) of the electron harvested by the collector or antenna and the resulting electron transfer to the PAG (resulting in fragmentation of the PAG and production of moiety 320 and moiety 330 and other possible fragments).

Figure 4:
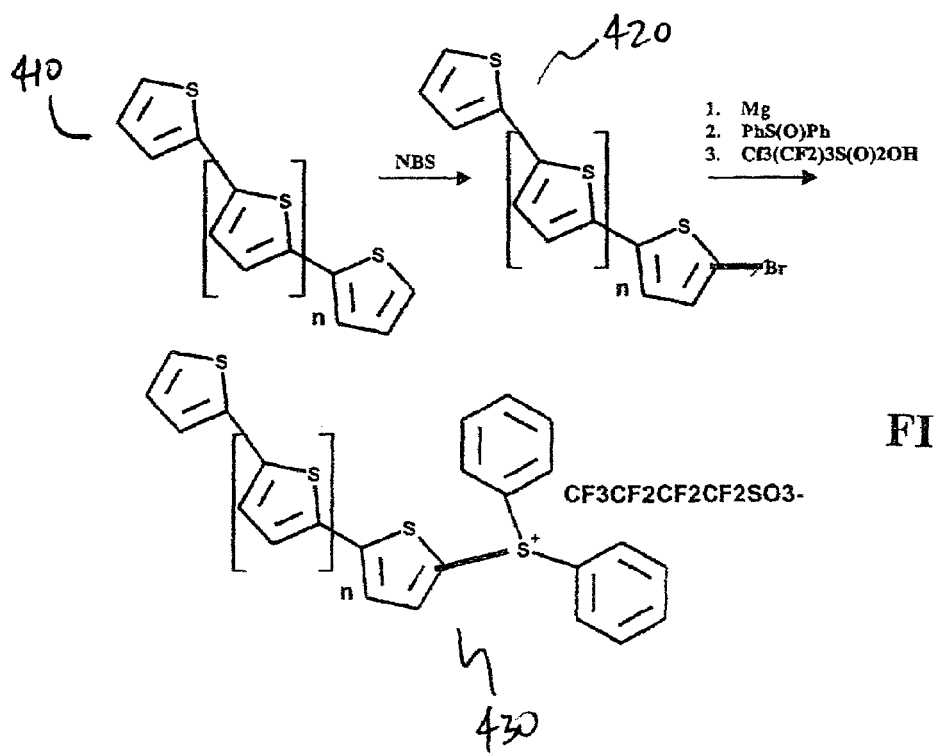
FIG. 4 shows a synthesis of a PAG functionalized with a conductive polymer collector or antenna.

FIG. 4 illustrates one technique of forming a molecule including a sulfonium PAG and a collector or antenna. As illustrated, oligothiophene 410 is initially reacted with N-bromosuccinimide (NBS) to form halogenated oligomer 420. Halogenated oligomer 420 is then reacted with magnesium metal to form an organo-magnesium species (a "Grignard intermediate"), which is then treated with diphenyl sulfone followed by nonfluorosulfonic acid to render molecule 430 of a sulfonium PAG having a collector or antenna covalently bonded thereto. In this example, an oligothiopene is covalently bonded to the sulfur atom of the PAG.

Figure 5:
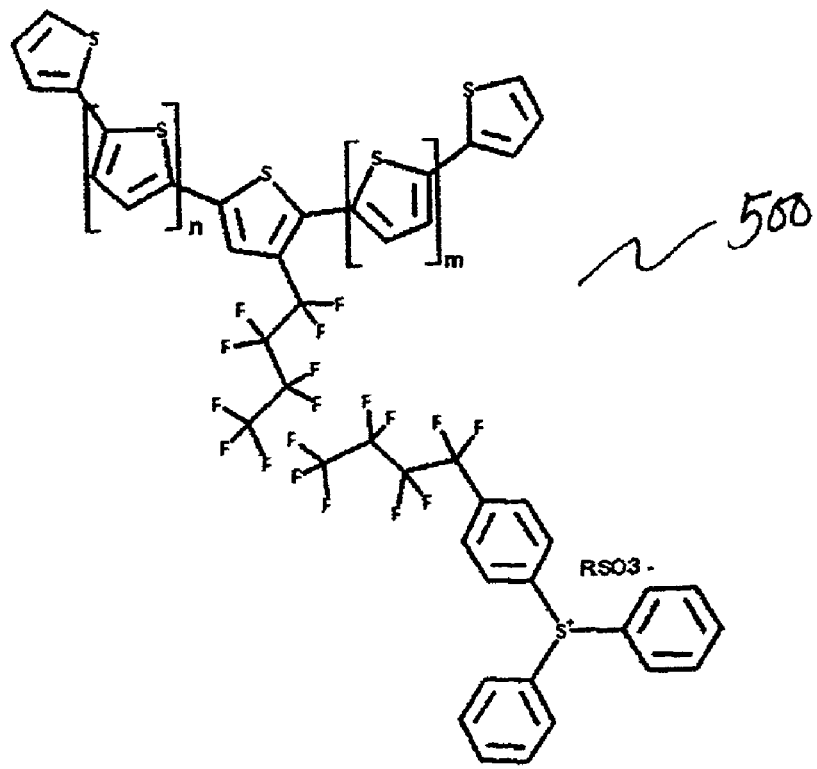
FIG. 5 shows a chemical representation of a PAG associated with a conductive polymer collector or antenna through hydrophobic forces.

FIG. 5 illustrates an example of a PAG having a hydrophobically associated collector or antenna. In this example, a sulfonium PAG functionalized with a fluorous moiety is paired with a conductive polymer (in this example, oligothiophene) functionalized with a fluorous moiety in order to elicit hydrophobic clustering of the collector or antenna with the PAG collectively shown as cluster 500. The collector or antenna in this example will tend to harvest electrons for the PAG and therefore increase the electron capture cross-section of the PAG molecule. Representatively, when the collector or antenna is excited by an energy source (e.g., electrons or photonic), the collector or antenna will change its polarity. The change of polarity is sensed by the PAG causing the PAG to fragment.

Figure 6:
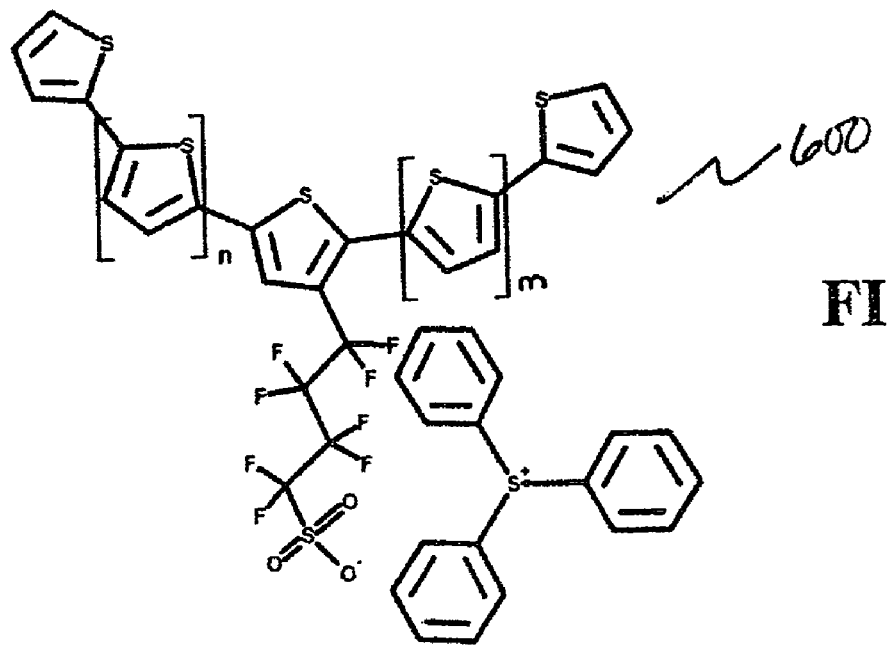
FIG. 6 shows a chemical representation of a PAG functionalized with a conductive polymer collector or antenna through ionic bonding.

FIG. 6 illustrates an example of a PAG linked to a collector or antenna through an ionic bond. In this example, a sulfonium PAG is paired with a conductive polymer (in this example, oligothiophene) functionalized with a fluorous moiety and an anionic moiety ($SO_3^-$) in order to drive ionic clustering of the collector or antenna with a positively charged PAG illustrated as cluster 600. Again, the collector or antenna in this example will tend to harvest electrons for the PAG and therefore increase the electron capture cross-section of the PAG molecule. Representatively, when the collector or antenna is excited by an energy source, the collector or antenna will change its polarity. The change of polarity is sensed by the PAG causing the PAG to fragment.

In the examples presented above, a sulfonium PAG is presented. It is to be appreciated that a sulfonium PAG is one example and that extending the electron capture cross-section of other PAGs is similarly contemplated. Other suitable PAGs include, but are not limited to, nonionic PAGs and iodonium PAGs. Similarly, the electron capture cross-section may be implemented in non-chemically amplified systems such as PACs.

As noted above, the compositions, article of manufactures and methods are suitable, in one embodiment, for use in photoresist compositions suitable for use in patterning circuit devices using EUV. Other applications are also contemplated as are other exitation sources. Other applications include lithographic mask fabrication, MEMS, microfluidic technology and biotechnology. Other ionizing radiation sources include, but are not limited to, x-ray and electron exposure sources.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A composition comprising:
    a first moiety having a property capable of modifying a solubility of the composition in response to an energy transfer; and
    a different second moiety capable of harvesting energy from an external source, wherein the second moiety is positioned such that energy harvested at the second moiety may be transferred to the first moiety, and wherein the second moiety and the first moiety are hydrophobically linked.

2. The composition of claim 1, wherein the first moiety is a photoacid generator.

3. The composition of claim 1, wherein the energy transfer is a result of photon impingement on the composition.

4. The composition of claim 3, wherein the photon impingement has a wavelength in the range of extreme ultraviolet.

5. An article of manufacture comprising:
    a film comprising a first moiety having a property capable of modifying a composition from which the film is derived in response to an energy transfer and a different second moiety capable of harvesting energy from an external source, wherein the second moiety is positioned such that collectively the first moiety and the second moiety have an electron capture cross-section greater than the electron capture cross-section of the first moiety alone, and wherein the second moiety and the first moiety are hydrophobically bonded.

6. The article of manufacture of claim 5, wherein the first moiety is a photoacid generator.

7. The article of manufacture of claim 5, wherein the energy transfer is a result of photon impingement of the article of manufacture.

8. The article of manufacture of claim 7, wherein the photon impingement has a wavelength in the range of extreme ultraviolet.

9. A method comprising:
    forming a film on a substrate, wherein the film comprises a first moiety comprising a sulfonium photo acid generator comprising a sulfur atom having a positive charge and an anion of a strong acid, the photo acid generator having a property capable of modifying the composition in response to an energy transfer and a different second moiety capable of harvesting energy from an external source, and wherein the first moiety and the second moiety are hydrophobically bonded;
    exposing the film to photonic or charged particle radiation; and
    patterning the film.

10. The method of claim 9, wherein the photo acid generator comprises a triphenyl sulfonium.

11. The method of claim 10, wherein the anion of a strong acid is selected from the group consisting of nonafluorobutane sulfonate, hexafluoroantimonate, and perfluorooctane sulfonate.

* * * * *